United States Patent
Oyama et al.

(10) Patent No.: US 11,937,376 B2
(45) Date of Patent: Mar. 19, 2024

(54) DETERMINATION DEVICE AND COMPONENT MOUNTING APPARATUS

(71) Applicant: FUJI CORPORATION, Chiryu (JP)

(72) Inventors: Shigeto Oyama, Kariya (JP); Haruna Narita, Higashiura-cho (JP)

(73) Assignee: FUJI CORPORATION, Chiryu (JP)

( * ) Notice: Subject to any disclaimer, the term of this patent is extended or adjusted under 35 U.S.C. 154(b) by 721 days.

(21) Appl. No.: 17/057,452

(22) PCT Filed: May 31, 2018

(86) PCT No.: PCT/JP2018/021035
§ 371 (c)(1),
(2) Date: Nov. 20, 2020

(87) PCT Pub. No.: WO2019/229953
PCT Pub. Date: Dec. 5, 2019

(65) Prior Publication Data
US 2021/0219478 A1    Jul. 15, 2021

(51) Int. Cl.
*H05K 13/04*        (2006.01)
*G05B 15/02*        (2006.01)
(Continued)

(52) U.S. Cl.
CPC .......... *H05K 13/086* (2018.08); *G05B 15/02* (2013.01); *G06Q 10/087* (2013.01); *H05K 13/02* (2013.01)

(58) Field of Classification Search
CPC .. H05K 13/02; H05K 13/0417; H05K 13/085; H05K 13/086; G05B 15/02; G06Q 10/087
See application file for complete search history.

(56) References Cited

U.S. PATENT DOCUMENTS 6,918,730 B2 *  7/2005 Kawai ................ H05K 13/0857
                                            414/937
7,395,129 B2 *  7/2008 Yamazaki ............ H05K 13/085
                                            700/121

(Continued)

FOREIGN PATENT DOCUMENTS

| EP | 3 190 864 A1   | 7/2017 |
| JP | 2004-47641 A   | 2/2004 |
| JP | 2015-149407 A  | 8/2015 |

OTHER PUBLICATIONS

International Search Report dated Jul. 24, 2018 in PCT/JP2018/021035 filed May 31, 2018, 1 page.

*Primary Examiner* — Paul D Kim
(74) *Attorney, Agent, or Firm* — Oblon, McClelland, Maier & Neustadt, L.L.P.

(57) ABSTRACT

A determination device determines a component feeder to be used from among the multiple component feeders attached to a feeder holding section. When a first specific type of component is supplied from a first specific component feeder, a second specific type of component supplied from a second specific component feeder are simultaneously picked up by a mounting head, and a component shortage occurs in the first specific component feeder, the determination device determines a same type component feeder attached to a position which enables simultaneous pickup with the second specific type of component supplied from the second specific component feeder, as a component feeder for supplying the first specific type of component.

11 Claims, 14 Drawing Sheets

(51) Int. Cl.
*G06Q 10/087* (2023.01)
*H05K 13/02* (2006.01)
*H05K 13/08* (2006.01)

(56) References Cited

U.S. PATENT DOCUMENTS 8,328,498 B2 * 12/2012 Higashida .......... H05K 13/0434
 414/806
9,955,617 B2 * 4/2018 Nozawa ............. H05K 13/0404
10,925,200 B2 * 2/2021 Iisaka et al. ....... H05K 13/0452

* cited by examiner

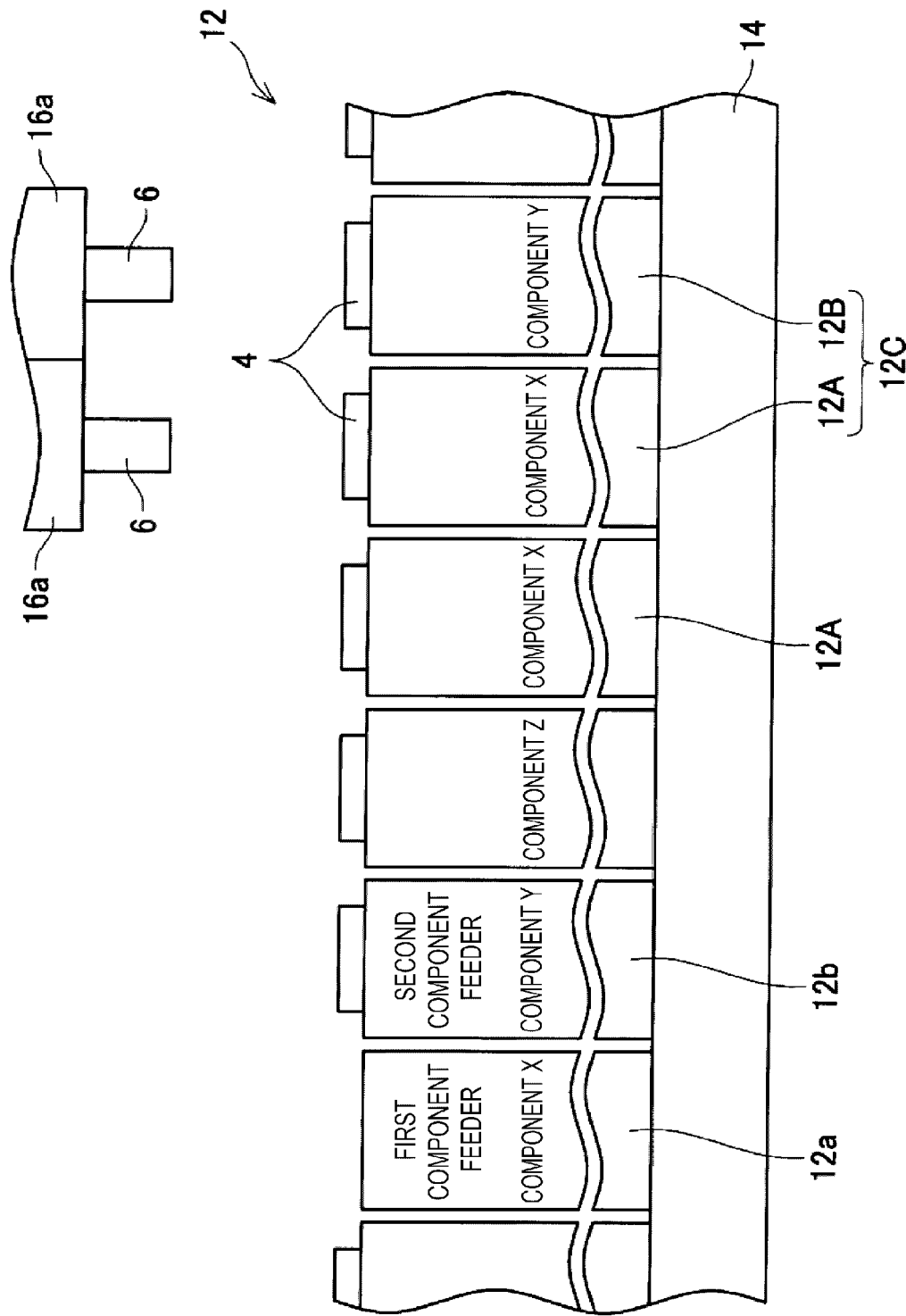

DETERMINATION DEVICE AND COMPONENT MOUNTING APPARATUS

TECHNICAL FIELD

The technique disclosed in the present description relates to a determination device for determining a component feeder to be used from among multiple component feeders attached to a feeder holding section, and a component mounting apparatus having the determination device.

BACKGROUND ART

Patent Literature 1 discloses an electronic component mounting device. The device determines an attachment position of the two original feeders to a position where the electronic components of each feeder can be picked up simultaneously by a mounting head. Then, the attachment position of the next feeder for accommodating the electronic component of the same type as one of the original feeders is determined to a position where the electronic component of the next feeder and the electronic component of the other original feeder can be simultaneously picked up by the mounting head.

PATENT LITERATURE

Patent Literature 1: JP-A-2015-149407

BRIEF SUMMARY

Technical Problem

In the technique of Patent Literature 1, the attachment position of the next feeder is determined with respect to the attachment position of the determined original feeder. In other words, it is necessary to pre-attach the original feeder and the next feeder to the determined attachment position. In the present description, there is provide a technique capable of mounting components efficiently in a state where multiple component feeders are attached in advance.

Solution to Problem

A determination device disclosed in the present description determines a component feeder to be used from among multiple component feeders attached to a feeder holding section, in a component mounting machine which includes the feeder holding section to which the multiple component feeders are attached and a mounting head capable of simultaneously picking up components from the multiple component feeders attached to the feeder holding section, and mounts the components picked up by the mounting head onto a board. The determination device includes: a component feeder information acquisition section configured to acquire an attachment position at which the component feeder is attached and a type of the component accommodated in the component feeder, for each component feeder attached to the feeder holding section; and a component feeder determination section configured to determine the component feeder for supplying a first specific type of component to the mounting head when component shortage occurs in a first specific component feeder, in a case where the first specific type of component supplied from the first specific component feeder and a second specific type of component supplied from a second specific component feeder are simultaneously picked up by the mounting head.

The component feeder determination section determines one first same type component feeder, being attached to a position which enables simultaneous pickup with the second specific type of component supplied from the second specific component feeder, as the component feeder for supplying the first specific type of component to the mounting head, based on an attachment position at which the first same type component feeder is attached and an attachment position at which the second specific component feeder is attached, in a case where multiple first same type component feeders for accommodating the first specific type of component are attached to the feeder holding section.

In the above-described determination device, from among the multiple first same type component feeders for accommodating the first specific type of component, the component feeder attached at the attachment position at which the simultaneous pickup with the component of the second specific component feeder is possible is determined as a component feeder to be used instead of the first specific component feeder when component shortage occurs in the first specific component feeder. Accordingly, when component shortage occurs in the first specific component feeder, by using the determined component feeder and the second specific component feeder, the mounting head can continue simultaneously picking up the first specific type of component and the second specific type of component. Therefore, it is possible to mount the components efficiently.

BRIEF DESCRIPTION OF DRAWINGS

FIG. 14 is a view illustrating an example of a combination of component feeders determined by the process of FIG. 13.

DESCRIPTION OF EMBODIMENTS

Figure 1:
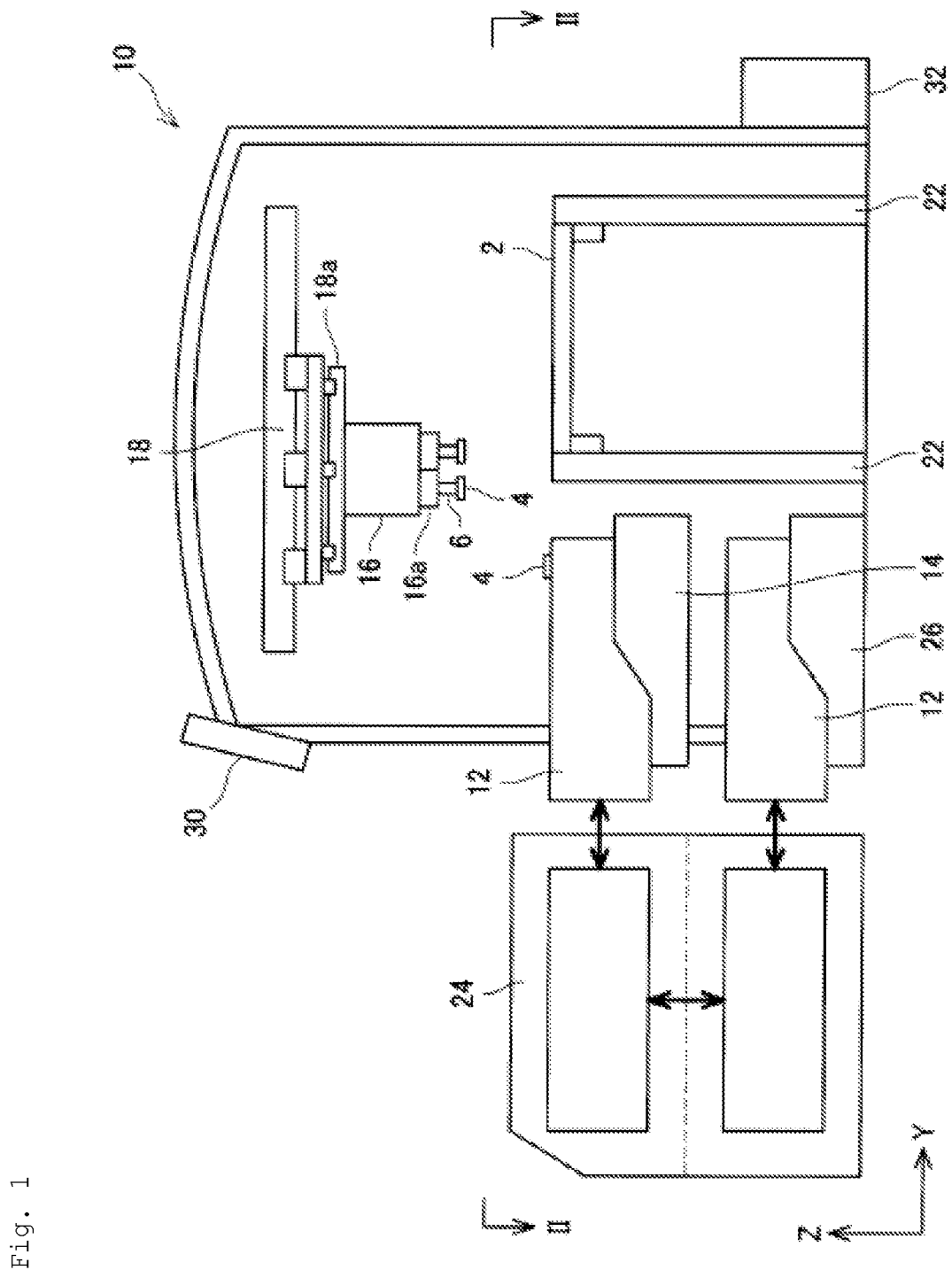
FIG. 1 is a side view schematically illustrating a configuration of a component mounting apparatus of an embodiment.

In one embodiment disclosed in the present description, the component mounting machine may further include a changing device for changing an attachment position of the component feeder attached to the feeder holding section. The component feeder information acquisition section may further acquire a use expiration date of the component accommodated in the component feeder for each component feeder attached to the feeder holding section. The determination device may further include: a first detecting section configured to detect a first expiration date component feeder of which a time point is reached a first predetermined period before the use expiration date, among the first same type component feeders for accommodating the first specific type of component; and a first output section configured to output information to the changing device for prompting to change an attachment position of the first expiration date component feeder to a position which enable simultaneous pickup by the mounting head, with respect to the attachment position at which the second specific component feeder is attached. In such a configuration, among the components accommodated in the component feeder attached to the feeder holding section, in a case where the component feeder for accommodating the components (for example, components of which the use expiration date is approaching) of which a time point is reached the first predetermined period before the use expiration date is present, information is output to the changing device for prompting to change the attachment position of the component feeder to the position which enables the simultaneous pickup with the component supplied from the second specific component feeder. Therefore, by changing the attachment position of the component feeder by the changing device, it is possible to simultaneously pick up the components of which the use expiration date is approaching by the mounting head, and the component can be used with priority. Therefore, it is possible to suppress the use expiration of the component.

In one embodiment disclosed in the present description, the component feeder information acquisition section may further acquire a use expiration date of the component accommodated in the component feeder, for each component feeder attached to the feeder holding section. The determination device may further include: a first detecting section configured to detect a first expiration date component feeder of which a time point is reached a first predetermined period before the use expiration date, among the first same type component feeders for accommodating the first specific type of component; and a second output section configured to output information for prompting to change an attachment position of the first expiration date component feeder to a position which enables simultaneous pickup by the mounting head, with respect to the attachment position at which the second specific component feeder is attached. In such a configuration, among the components accommodated in the component feeder attached to the feeder holding section, in a case where the component feeder for accommodating the components (for example, component of which the use expiration date is approaching) of which a time point is reached the first predetermined period before the use expiration date is present, information is output for prompting to change the attachment position of the component feeder to the position which enables the simultaneous pickup with the component supplied from the second specific component feeder. Therefore, for example, the attachment position of the component feeder is changed by an operator who recognizes the information, and accordingly, it is possible to simultaneously pick up the components of which the use expiration date is approaching by the mounting head, and the component can be used with priority. Therefore, it is possible to suppress the use expiration of the component.

In one embodiment disclosed in the present description, the component feeder information acquisition section may further acquire a use expiration date of the component accommodated in the component feeder, for each component feeder attached to the feeder holding section. The determination device may further include: a first detecting section configured to detect a first expiration date component feeder of which a time point is reached a first predetermined period before the use expiration date, among the first same type component feeders for accommodating the first specific type of component; and a third output section configured to output information to the component mounting machine for prompting to stop simultaneous pickup of the components from the first specific component feeder and the second specific component feeder, and use the component accommodated in the first expiration date component feeder. In such a configuration, among the components accommodated in the component feeder attached to the feeder holding section, in a case where the component feeder for accommodating the components (for example, the components of which the use expiration date is approaching) of which a time point is reached the first predetermined period before the use expiration date is present, in order to use the components of which the use expiration date is approaching prior to the simultaneous pickup during execution, the use expiration of the component is suppressed.

In one embodiment disclosed in the present description, the component mounting machine may further include a changing device for changing an attachment position of the component feeder attached to the feeder holding section. The determination device may further include: a second detecting section configured to detect a second expiration date component feeder of which a time point is reached a second predetermined period of which a period from the use expiration date is longer than that of the first predetermined period before the use expiration date among the first same type component feeders for accommodating the first specific type of component; and a fourth output section configured to output information to the changing device for prompting to change an attachment position of the second expiration date component feeder to a position which enables the simultaneous pickup by the mounting head, with respect to the attachment position at which the second specific component feeder is attached. In such a configuration, the changing device changes the attachment position of the component feeder for accommodating the components (for example, components of which the use expiration date is approaching) of which a time point is reached the second predetermined period before the use expiration date, and accordingly, when component shortage occurs in the first specific component feeder, the simultaneous pickup of the components can be performed using the component feeder. Therefore, it is possible to mount the components efficiently.

In one embodiment disclosed in the present description, the determination device may further include: a second detecting section configured to detect a second expiration date component feeder of which a time point is reached a second predetermined period of which a period from the use expiration date is longer than that of the first predetermined period before the use expiration date, among the first same type component feeders for accommodating the first specific type of component; and a fifth output section configured to output information for prompting to change an attachment position of the second expiration date component feeder to a position which enables the simultaneous pickup by the mounting head, with respect to the attachment position at which the second specific component feeder is attached. In such a configuration, the attachment position of the component feeder for accommodating the components (for example, the components of which the use expiration date is approaching) of which a time point is reached the second predetermined period before the use expiration date is changed by the operator who recognized the information, and accordingly, when component shortage occurs in the first specific component feeder, the simultaneous pickup of the components can be performed using the component feeder. Therefore, it is possible to mount the components efficiently.

In one embodiment disclosed in the present description, the component mounting machine may further include a changing device for changing an attachment position of the component feeder attached to the feeder holding section. The component feeder determination section may determine one first same type component feeder attached to the feeder holding section as the component feeder for supplying the first specific type of component to the mounting head, when component shortage occurs in the first specific component feeder, when the first same type component feeder attached to a position, which enables simultaneous pickup with the second specific type of component supplied from the second specific component feeder, is not present. The determination device may further include: a sixth output section configured to output information to the component mounting machine for prompting to subsequently pick up the second specific type of component supplied from the second specific component feeder and the first specific type of component supplied from the determined first same type component feeder; and a seventh output section configured to output information to the changing device for prompting to change an attachment position of the other one first same type component feeder for accommodating the first specific type of component to a position which enables the simultaneous pickup by the mounting head, with respect to the attachment position at which the second specific component feeder is attached. In such a configuration, when component shortage occurs in the first specific component feeder, in a case where the first same type component feeder is not present in the attachment position at which the simultaneous pickup is possible, by using the one first same type component feeder and the second specific component feeder, the instruction to pick up the components in order is output to the component mounting machine. Then, while picking up the components in order, the information is output to the changing device for prompting to change the other one first same type component feeder to the attachment position at which the simultaneous pickup with the components supplied from the second specific component feeder is possible. Therefore, by changing the attachment position of the other one first same type component feeder by the changing device, the simultaneous pickup of the components can be restarted, and until the component feeder that can simultaneously pick up the components can be prepared (until the attachment position is changed), by picking up the components in order, it is possible to suppress deterioration of production efficiency.

In one embodiment disclosed in the present description, the component feeder determination section may determine one first same type component feeder, being attached to the feeder holding section, as the component feeder for supplying the first specific type of component to the mounting head, when component shortage occurs in the first specific component feeder, when the first same type component feeder attached to a position, which enables simultaneous pickup with the second specific type of component supplied from the second specific component feeder, is not present. The determination device may further include: a sixth output section configured to output information to the component mounting machine for prompting to subsequently pick up the second specific type of component supplied from the second specific component feeder and the first specific type of component supplied from the determined first same type component feeder; and an eighth output section configured to output information for prompting to change an attachment position of the other one first same type component feeder for accommodating the first specific type of component to a position which enables the simultaneous pickup by the mounting head, with respect to the attachment position at which the second specific component feeder is attached. In such a configuration, when component shortage occurs in the first specific component feeder, in a case where the first same type component feeder is not present in the attachment position at which the simultaneous pickup is possible, by using the one first same type component feeder and the second specific component feeder, the instruction to pick up the components in order is output to the component mounting machine. Then, while picking up the components in order, information is output for prompting to change the other one first same type component feeder to the attachment position at which the simultaneous pickup with the component supplied from the second specific component feeder is possible. Therefore, for example, the attachment position of the other one first same type component feeder is changed by the operator who recognized the information, the simultaneous pickup of the components can be restarted, and until the component feeder that can simultaneously pick up the components can be prepared (until the attachment position is changed), by picking up the components in order, it is possible to suppress deterioration of production efficiency.

In one embodiment disclosed in the present description, the component feeder determination section may determine a combination of the first same type component feeder and the second same type component feeder which are attached in a positional relationship in which simultaneous pickup of the first specific type of component and the second specific type of component is possible, from among the first same type component feeders and the second same type component feeders, when component shortage occurs in the first specific component feeder, in a case where multiple second same type component feeders for accommodating the second specific type of component are attached to the feeder holding section, when the first same type component feeder attached to a position, which enables simultaneous pickup with the second specific type of component supplied from the second specific component feeder, is not present. The determination device may further include a ninth output section configured to output information to the component mounting machine for prompting to simultaneously pick up the first specific type of component and the second specific type of component which are supplied from the combination of the first same type component feeder and the second same type component feeder. In such a configuration, when the component shortage occurs in the first specific component feeder, in a case where the first same type component feeder is not present at the attachment position at which the simultaneous pickup with the components supplied from the second specific component feeder is possible, the combination of the first same type component feeder and the second same type component feeder in the positional relationship in which the simultaneous pickup of the components is possible is determined, and the information is output to the component mounting machine for prompting to perform the simultaneous pickup of the components supplied from the combination. Therefore, when the component shortage occurs in the first specific component feeder, even in a case where the first same type component feeder capable of simultaneously picking up the components of the second specific component feeder, it is possible to continue simultaneously picking up the components, and to maintain the mounting efficiency of the components.

In one embodiment disclosed in the present specification, the determination device may further include: a production information acquisition section configured to acquire a production plan and a production speed of the component mounting machine. The component feeder determination section may determine to continue using the first specific component feeder even when a time point is reached a first predetermined period before the use expiration date, in a case where it is determined that it is possible to use all of the components accommodated in the first expiration date component feeder until the use expiration date of the first expiration date component feeder is reached, in a case of using the first expiration date component feeder after component shortage occurs in the first specific component feeder, based on the production plan and the production speed. In such a configuration, in a case where it is determined that all of the components accommodated in the first expiration date component feeder after the component shortage of the first specific component feeder currently in use occurs can be used until the use expiration date is reached, the use of the first specific component feeder is continued, and thus, it is possible to reduce the number of times of switching of the component feeder to be used. Therefore, it is possible to suppress deterioration of mounting efficiency of the components.

FIRST EMBODIMENT

Hereinafter, with reference to the drawings, component mounting apparatus 10 (hereinafter, referred to as mounting apparatus 10) according to an embodiment will be described. Mounting apparatus 10 is a device for mounting electronic component 4 on circuit board 2. Mounting apparatus 10 is also referred to as a surface mounting machine or a chip mounting apparatus. Normally, mounting apparatus 10 is provided together with other board work machines such as a solder printing machine and a board inspection machine to make up a series of mounting lines.

Figure 2:
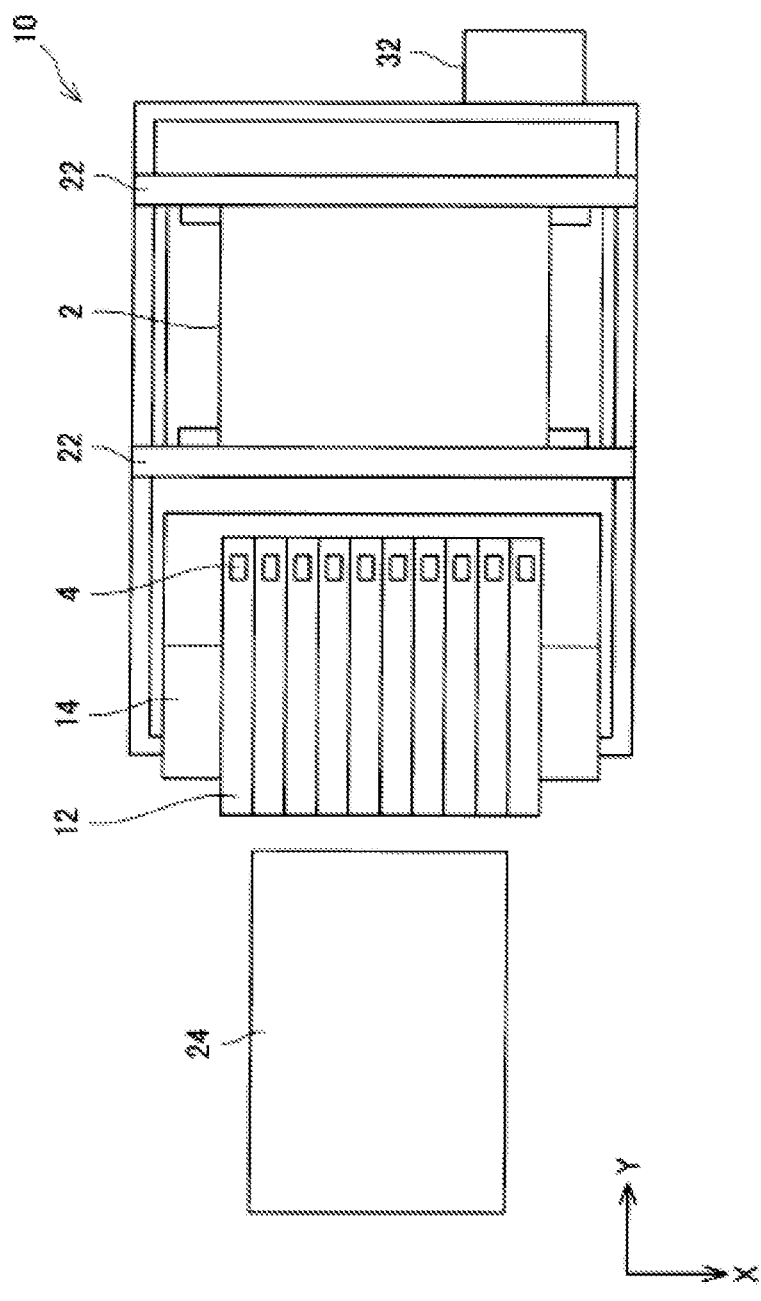
FIG. 2 is a sectional view taken along line II-II of FIG. 1.

As illustrated in FIGS. 1 and 2, mounting apparatus 10 includes multiple component feeders 12, feeder holding section 14, mounting head 16, head moving mechanism 18, board chute 22, loader 24, feeder accommodation section 26, touch panel 30, and control device 32.

Each component feeder 12 accommodates multiple electronic components 4. Component feeder 12 is detachably attached to feeder holding section 14 and supplies electronic components 4 to mounting head 16. A specific configuration of component feeder 12 is not particularly limited, but for example, any one of a tape-type feeder which accommodates multiple electronic components 4 on a wound tape, a tray-type feeder that accommodates multiple electronic components 4 on a tray, and a bulk-type feeder that randomly accommodates multiple electronic components 4 within a container may be employed.

Feeder holding section 14 has multiple slots, and component feeder 12 is detachably installed in each of the multiple slots. Feeder holding section 14 may be fixed to mounting apparatus 10 or may be detachably attached to mounting apparatus 10. Feeder accommodation section 26 is provided below feeder holding section 14. In feeder accommodation section 26, multiple component feeders 12 installed in feeder holding section 14 are accommodated.

Loader 24 is a device for automatically performing the installation and removal of component feeder 12 to feeder holding section 14. Loader 24 is configured to remove component feeder 12 to be replaced from feeder holding section 14 and collect removed feeder accommodation section 26 to feeder accommodation section 26, and to remove component feeder 12 to be used in a production operation from feeder accommodation section 26 and install component feeder 12 in feeder holding section 14. Multiple mounting apparatuses 10 are arranged along the direction (X direction) perpendicular to the paper surface, and loader 24 is movable in parallel to each slot of multiple feeder holding sections 14 of multiple mounting apparatuses 10 by a guide rail (not illustrated) provided along the X direction. Loader 24 includes a control device (not illustrated), and the control device is configured to be capable of communicating with control device 32 (described later) of mounting apparatus 10.

Figure 6:
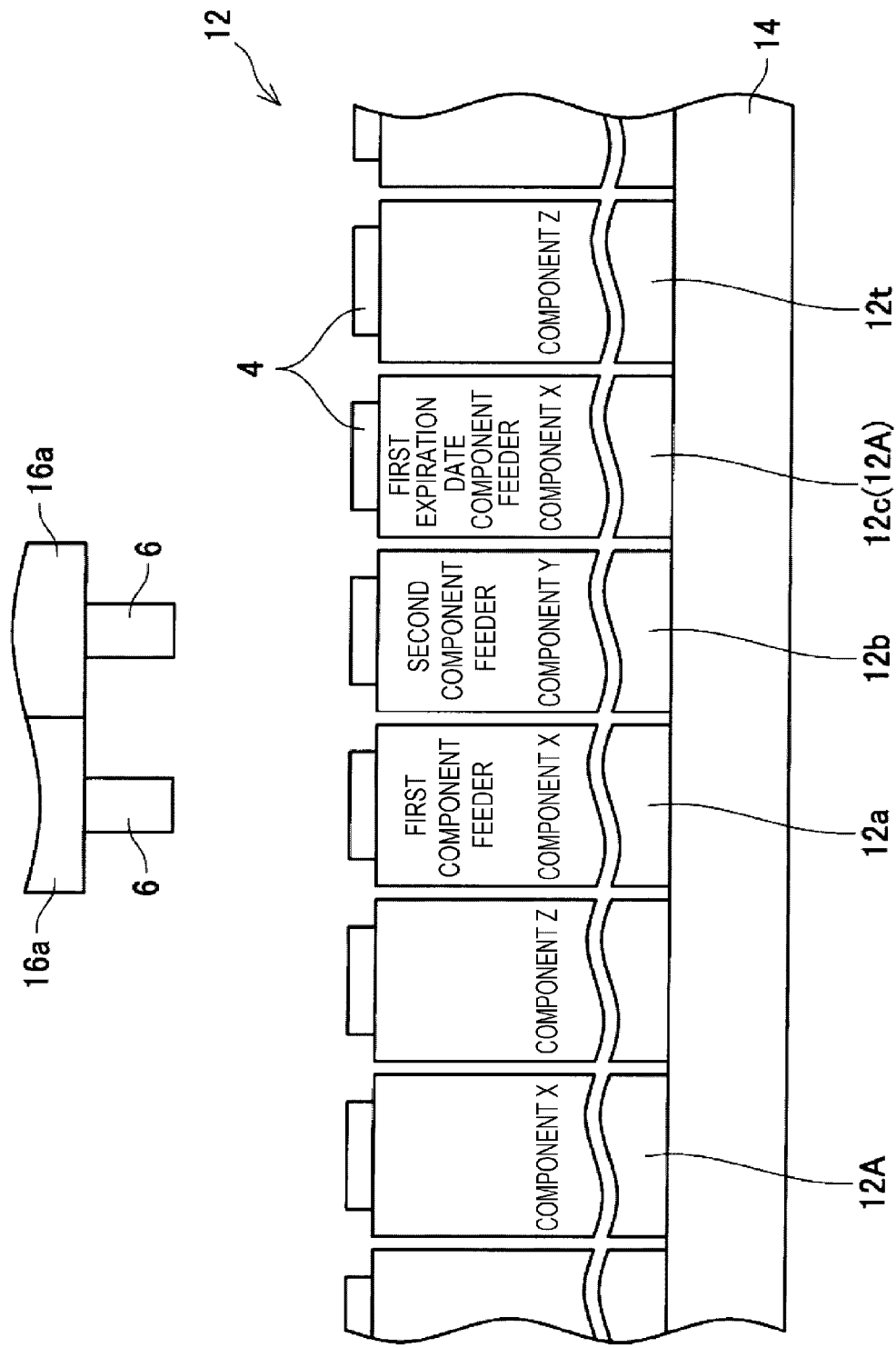
FIG. 6 is a view illustrating a state where the attachment position of the first expiration date component feeder has been changed.

Mounting head 16 is configured to be capable of attaching and detaching nozzle 6 for picking up electronic component 4 to and from holding section 16a. Mounting head 16 picks up electronic component 4 supplied from component feeder 12 by nozzle 6 attached to holding section 16a, and mounts electronic component 4 on circuit board 2. At this time, head moving mechanism 18 moves mounting head 16 with respect to component feeder 12 and circuit board 2. In the present embodiment, mounting head 16 has multiple holding sections 16a, and it is possible to attach nozzle 6 to each of multiple holding sections 16a. Further, mounting head 16 can simultaneously pick up electronic component 4 from at least two component feeders 12 by nozzles 6 respectively attached to multiple holding sections 16a (for example, refer to FIGS. 4 and 6).

Board chute 22 conveys in, supports, and conveys out circuit board 2. Touch panel 30 is a display device for providing the operator with various types of information, and is a user interface for receiving a command or information from the operator.

Control device 32 is configured with a computer including CPU, RAM, and ROM. Control device 32, for example, controls the operations of each section of mounting apparatus 10 based on the production plan. Further, control device 32 is also a determination device that determines component feeder 12 to be used by mounting device 10 from among multiple component feeders 12 attached to feeder holding section 14. Hereinafter, with reference to FIG. 3, in order to determine component feeder 12 to be used by mounting apparatus 10, the process executed by control device 32 will be described. In the present embodiment, control device 32 has a function of the determination device that determines component feeder 12 to be used by mounting device 10, but the determination device may be a device separate from control device 32, or may be a device disposed at a position away from mounting apparatus 10.

Figure 3:
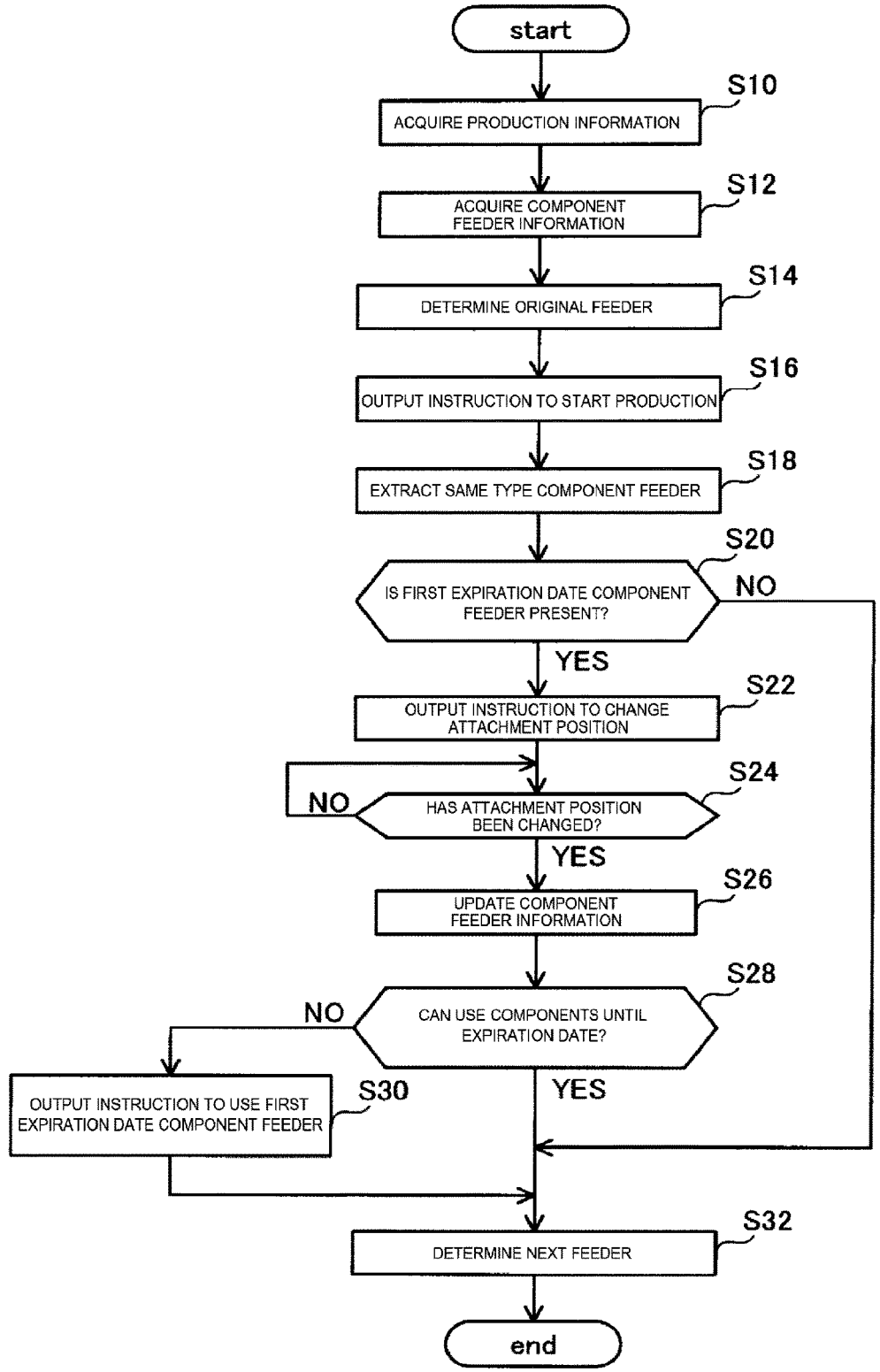
FIG. 3 is a flowchart illustrating a process executed by a control device (determination device) of a first embodiment.

As illustrated in FIG. 3, control device 32 determines component feeder 12 to be used by mounting apparatus 10 based on the production plan of mounting apparatus 10. The process of FIG. 3 is executed in a state where multiple component feeders 12 are attached to feeder holding section 14 of mounting apparatus 10 in advance. The process of FIG. 3, for example, may be started with the input of the execution instruction by the operator who has confirmed the mounting of the desired number of component feeders 12 as a trigger, or may be started with the detection by control device 32 about a predetermined number of component feeders 12 are mounted, as a trigger.

In S10, control device 32 acquires production information. Production information is information indicating the production plan and the production speed of each job to be produced (process for mounting electronic component 4 on circuit board 2). The production information may be acquired, for example, by the input of an operator to touch panel 30, or may be acquired by the reception from an external device (not illustrated).

In S12, control device 32 acquires component feeder information. The component feeder information is information indicating an attachment position at which each component feeder 12 is attached, a type of electronic component 4 accommodated in each component feeder 12, and a use expiration date of electronic component 4 accommodated in each component feeder 12, for each component feeder 12 attached to feeder holding section 14. The use expiration date of electronic component 4 is determined, for example, at a predetermined period from the timing when stored electronic component 4 is delivered from the storage location. The timing at which each electronic component 4 is delivered is managed by, for example, an identification number assigned to each electronic component 4. The use expiration date of each electronic component 4 may be input to touch panel 30 by an operator, for example.

Figure 4:
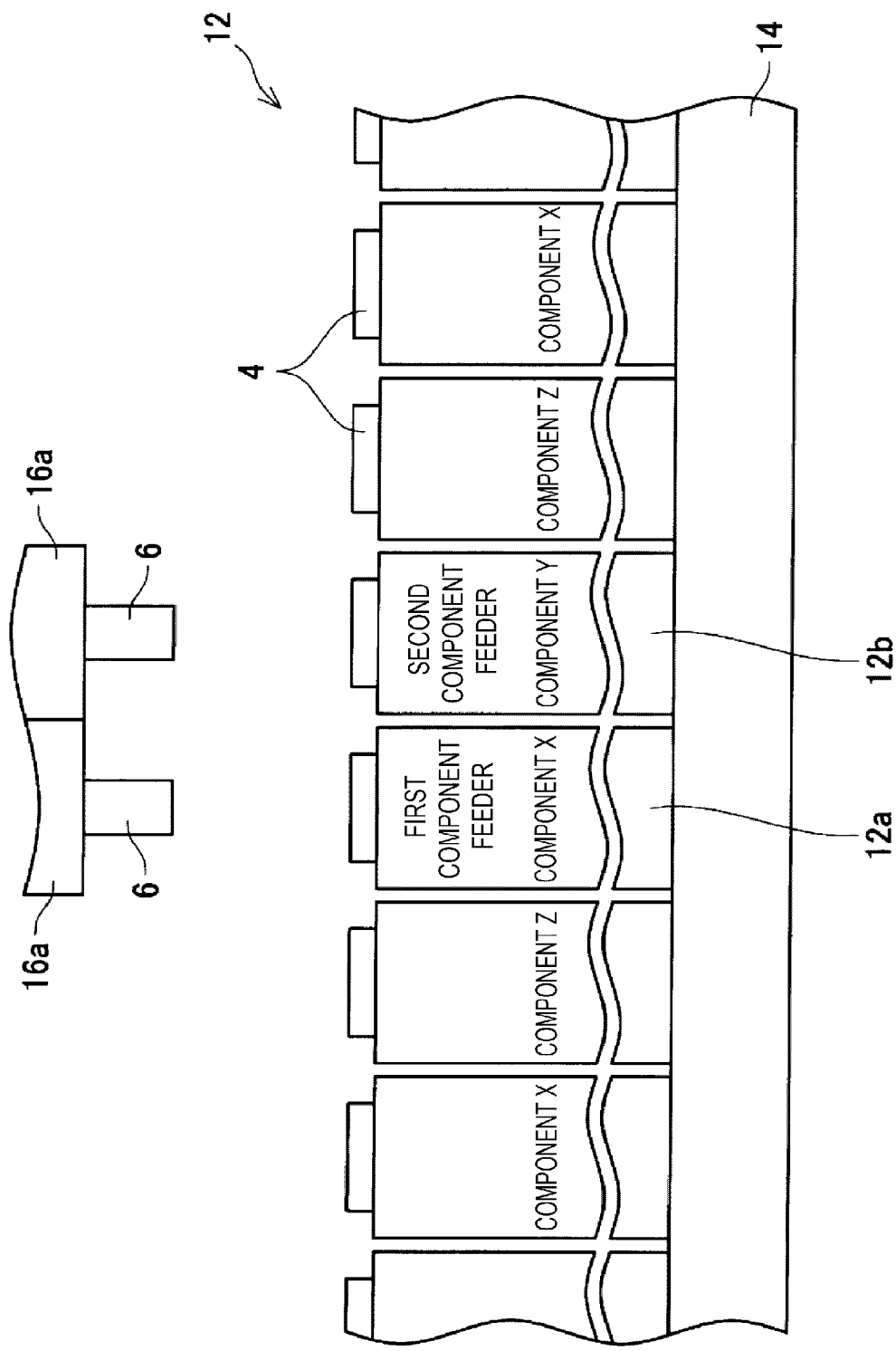
FIG. 4 is a view illustrating an example of an original feeder determined by the process of FIG. 3.

In S14, control device 32 determines an original feeder based on the production information. The original feeder is component feeder 12 for supplying electronic component 4 to mounting head 16 prior to the next feeder (described later). The next feeder is component feeder 12 for supplying electronic components 4 to mounting head 16 instead of the original feeder in a case where component shortage occurs in the original feeder. Typically, the supply number of multiple electronic components 4 mounted on one circuit board 2 is not sufficient only with the original feeder, and thus the next feeder is prepared. In S14, for example, in a case of using component X and component Y in the job to be produced, control device 32 selects two component feeders 12 attached in the positional relationship in which the simultaneous pickup of component X and component Y is possible from among the multiple component feeders 12 for accommodating multiple component feeders 12 for accommodating components X and multiple component feeders 12 for accommodating components Y. Specifically, as illustrated in FIG. 4, control device 32 determines first component feeder 12a for accommodating component X, and second component feeder 12b for accommodating component Y, as an original feeder.

In S16, control device 32 outputs an instruction to start the production operation to each section (mounting head 16, head moving mechanism 18, board chute 22, and the like) using the original feeder determined in S14. Accordingly, mounting head 16 starts to simultaneously pick up components X and Y from first component feeder 12a and second component feeder 12b, and the production operation is executed according to the acquired production plan. Incidentally, in each of the following embodiments, the description will be continued assuming that component feeder 12 to be used is determined from the two original feeders in a case where component shortage occurs in first component feeder 12a.

In S18, control device 32 extracts first same type component feeder 12A (refer to FIG. 5) from among multiple component feeders 12 attached to feeder holding section 14. First same type component feeder 12A is component feeder 12 for accommodating the same type of component (that is, component X) as the component accommodated in first component feeder 12a.

In S20, control device 32 determines whether first expiration date component feeder 12c (refer to FIG. 5) is present. First expiration date component feeder 12c is component feeder 12 in which a time point is reached a first predetermined period (for example, three hours) before the use expiration date among first same type component feeders 12A. When it is determined that first expiration date component feeder 12c is present (YES in S20), the process proceeds to S22, and when it is determined that first expiration date component feeder 12c is not present (NO in S20), the process proceeds to S32.

Figure 5:
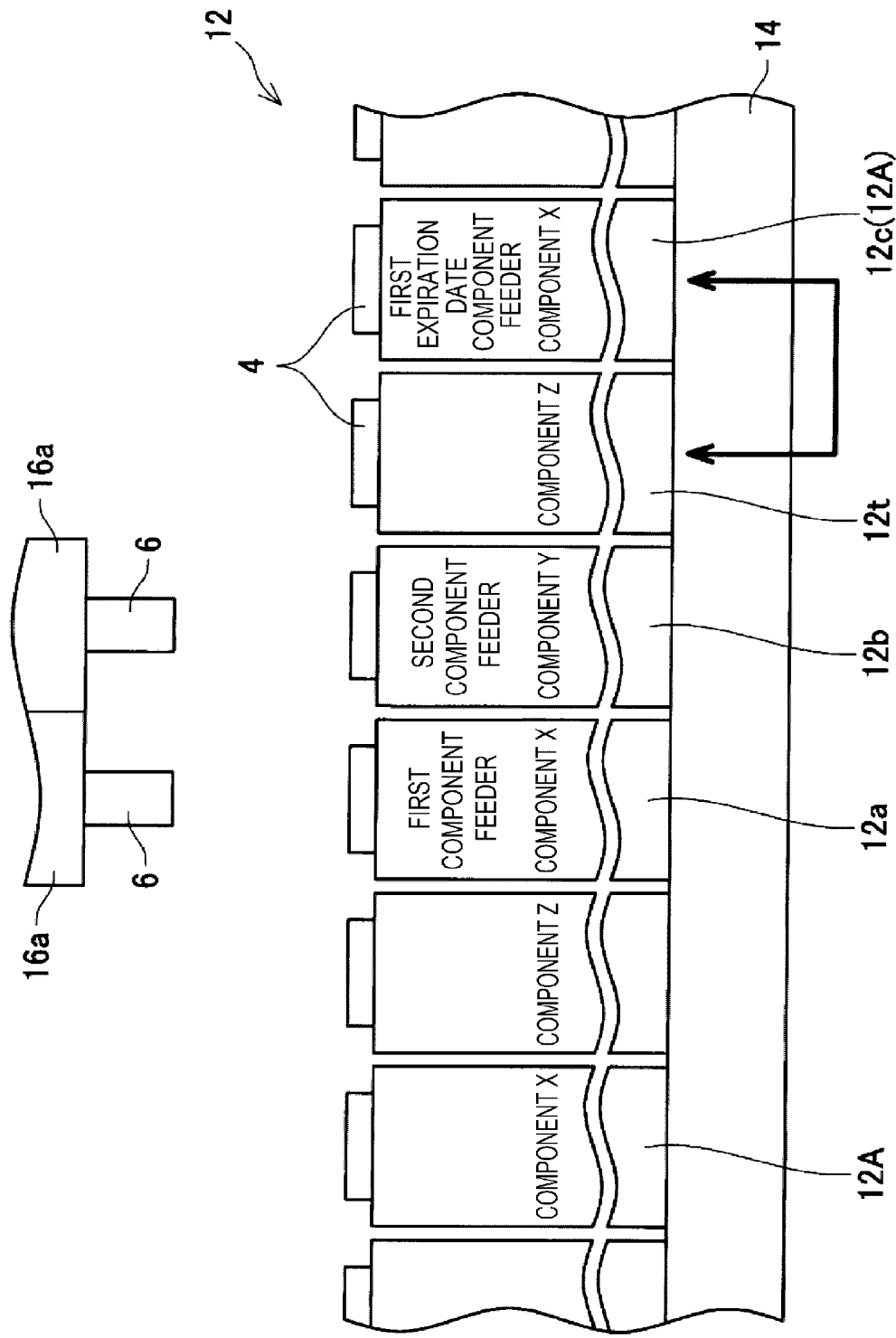
FIG. 5 is a view illustrating a state of changing an attachment position of a first expiration date component feeder.

In S22, control device 32 outputs an instruction to loader 24 to change the attachment position of first expiration date component feeder 12c to a position which enables the simultaneous pickup by mounting head 16, with respect to the attachment position at which second component feeder 12b is attached. For example, as illustrated in FIG. 5, in a case where first expiration date component feeder 12c is present, control device 32 outputs an instruction to loader 24 to replace the attachment position of first expiration date component feeder 12c and the attachment position (that is, a position at which the simultaneous pickup by mounting head 16 is possible with respect to the attachment position at which second component feeder 12b is attached) of component feeder 12t for accommodating the components (component Z in FIG. 5) different from component X. Accordingly, loader 24 executes an operation of replacing the attachment position of first expiration date component feeder 12c and the attachment position of component feeder 12t.

In S24, control device 32 determines whether the change of the attachment position according to the instruction output to loader 24 in S22 has been completed. In a case where it is determined that the change of the attachment position has been completed (YES in S24), the process proceeds to S26, and in a case where it is determined that the change of the attachment position has not been completed (NO in S24), S24 is repeated until YES is determined in S24.

In S26, control device 32 updates component feeder information. As described above, in S24, since the attachment position of first expiration date component feeder 12c and component feeder 12t has been changed, control device 32 updates the attachment position at which each component feeder 12 is attached, and the type of electronic component 4 accommodated in each component feeder 12, for each component feeder 12 attached to feeder holding section 14, to the latest information (refer to FIG. 6).

In S28, based on the obtained production information, in a case of using first expiration date component feeder 12c after component shortage occurs in first component feeder 12a, control device 32 determines whether all of components X accommodated in first expiration date component feeder 12c can be used until the use expiration date is reached. During the production operation, control device 32 grasps the remaining number of components X accommodated in the original feeder (that is, first component feeder 12a). Therefore, based on the remaining number of components X currently accommodated in first component feeder 12a, the production speed of the current job, the accommodation number of components X accommodated in first expiration date component feeder 12c, and the like, in a case where first expiration date component feeder 12c is used after component shortage occurs in first component feeder 12a, control device 32 determines whether all of components X accommodated in first expiration date component feeder 12c can be used until the use expiration date is reached. In a case where it is determined that all of components X accommodated in first expiration date component feeder 12c can be used (YES in S28), the process proceeds to S32, and in a case where it is determined that all of components X accommodated in first expiration date component feeder 12c cannot be used (that is, cannot be used up until the use expiration date is reached) (NO in S28), the process proceeds to S30.

In S30, control device 32 outputs an instruction to use first expiration date component feeder 12c. When using first expiration date component feeder 12c after component shortage occurs in first component feeder 12a, since it is determined that it is not possible to use up components X accommodated in first expiration date component feeder 12c until the use expiration date is reached, control device 32 determines to use first expiration date component feeder 12c with priority instead of first component feeder 12a.

Figure 7:
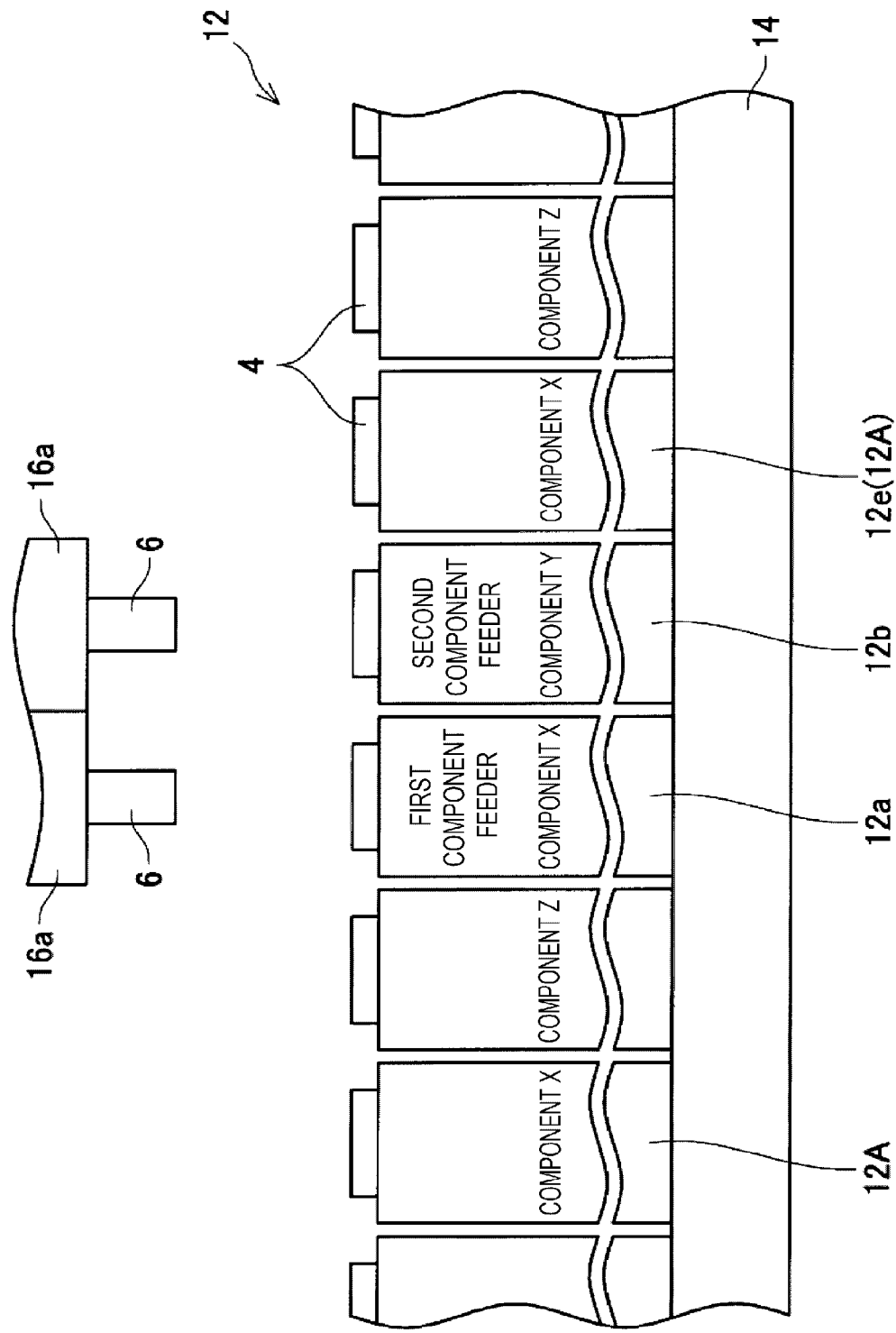
FIG. 7 is a view illustrating an example of a next feeder determined by the process of FIG. 3.

In S32, control device 32 determines the next feeder. Specifically, in a case of NO in S20, for example, as illustrated in FIG. 7, based on the attachment position at which each first same type component feeder 12A is attached and the attachment position at which second component feeder 12b is attached, control device 32 determines first same type component feeder 12A attached to the position at which the simultaneous pickup with components Y supplied from second component feeder 12b is possible as next feeder 12e. In a case of YES in S28, control device 32 determines first expiration date component feeder 12c of which the attachment position has been changed as the next feeder. In other words, a case of YES in S28 is a case where all of components X accommodated in first expiration date component feeder 12c can be used until the use expiration date is reached when first expiration date component feeder 12c is used after component shortage occurs in first component feeder 12a, and thus control device 32 continues using first component feeder 12a and determines first expiration date component feeder 12c as the next feeder. Further, in a case of passing through S30, first expiration date component feeder 12c is used instead of first component feeder 12a, control device 32 determines first component feeder 12a as the next feeder. Accordingly, when component shortage occurs in the component feeder (first component feeder 12a or first expiration date component feeder 12c) which is in use, mounting head 16 can simultaneously pick up components X and Y from second component feeder 12b and the next feeder. When executing S30, control device 32 ends the series of processes.

As described above, control device 32 of the present embodiment determines component feeder 12 attached to the attachment position at which the simultaneous pickup with component Y of second component feeder 12b is possible as next feeder 12e to be used instead of first component feeder 12a when component shortage occurs in first component feeder 12a, among multiple first same type component feeders 12A for accommodating components X (No in S20, S32). Accordingly, when component shortage occurs in first component feeder 12a, by using next feeder 12e and second component feeder 12b, mounting head 16 can continue the simultaneous pickup of components X and Y. Therefore, it is possible to mount the components efficiently.

In a case where first expiration date component feeder 12c (that is, component feeder 12 for accommodating the components of which the use expiration date is approaching) is present among first same type component feeders 12A (YES in S20), control device 32 outputs information to loader 24 for prompting to change the attachment position of first expiration date component feeder 12c to the position at which the simultaneous pickup with components Y supplied from second component feeder 12b is possible (S22). Therefore, by changing the attachment position of first expiration date component feeder 12c by loader 24, it is possible to use (simultaneously pick up) components X of which the use expiration date is approaching, with priority. Therefore, it is possible to suppress the use expiration of components X.

Furthermore, even in a situation where first expiration date component feeder 12c is present, in a case of using first expiration date component feeder 12c after component shortage occurs in first component feeder 12a, based on the acquired production information, in a case where it is determined that all of components X accommodated in first expiration date component feeder 12c can be used until the use expiration date thereof is reached (YES in S28), control device 32 continues using first component feeder 12a even when a time point is reached the first predetermined period before the use expiration date and determines first expiration date component feeder 12c as the next feeder (S32). Therefore, it is possible to reduce the number of times of switching of component feeder 12 to be used, and it is possible to suppress deterioration of mounting efficiency of components.

SECOND EMBODIMENT

Figure 8:
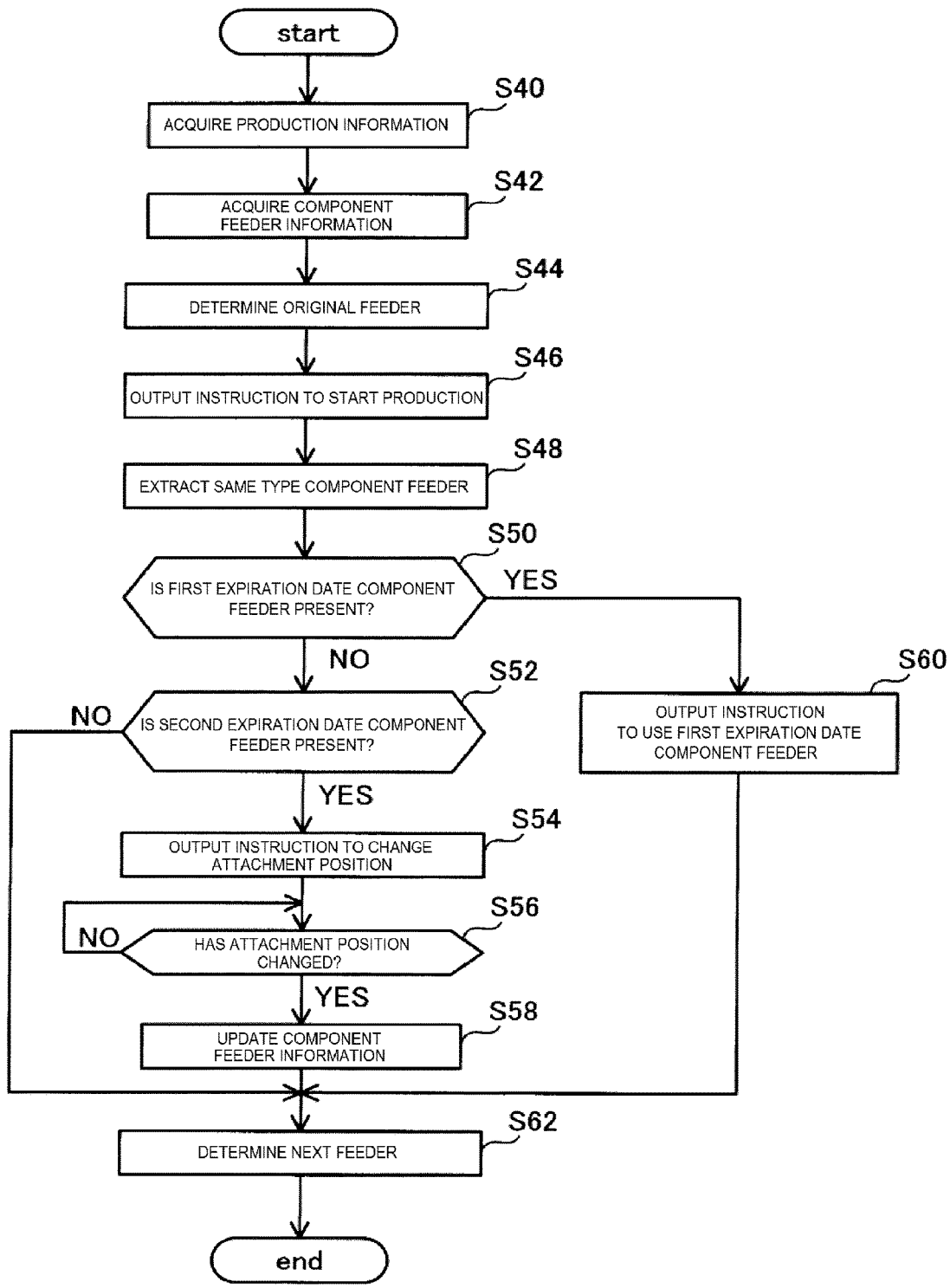
FIG. 8 is a flowchart illustrating a process executed by a control device (determination device) of a second embodiment.

Next, a mounting apparatus according to a second embodiment will be described. In the present embodiment, the configuration of the mounting apparatus is the same as that in the first embodiment, but the process of control device 32 according to the presence or absence of first expiration date component feeder 12c is different. Hereinafter, with reference to FIG. 8, the process in which control device 32 of the second embodiment determines component feeder 12 to be used by the mounting apparatus will be described.

S40 to S50 are respectively the same as S10 to S20 in FIG. 3. In a case where it is determined that first expiration date component feeder 12c is not present (NO in S50), in S52, control device 32 determines whether second expiration date component feeder 12d is present. Second expiration date component feeder 12d is component feeder 12 of which a time point is reached a second predetermined period (for example, 4 hours) of which a period from the use expiration date is longer than that of the first predetermined period before the use expiration date among first same type component feeders 12A. When it is determined that second expiration date component feeder 12d is present (YES in S52), the process proceeds to S54, and when it is determined that second expiration date component feeder 12d is not present (NO in S52), the process proceeds to S62.

Figure 9:
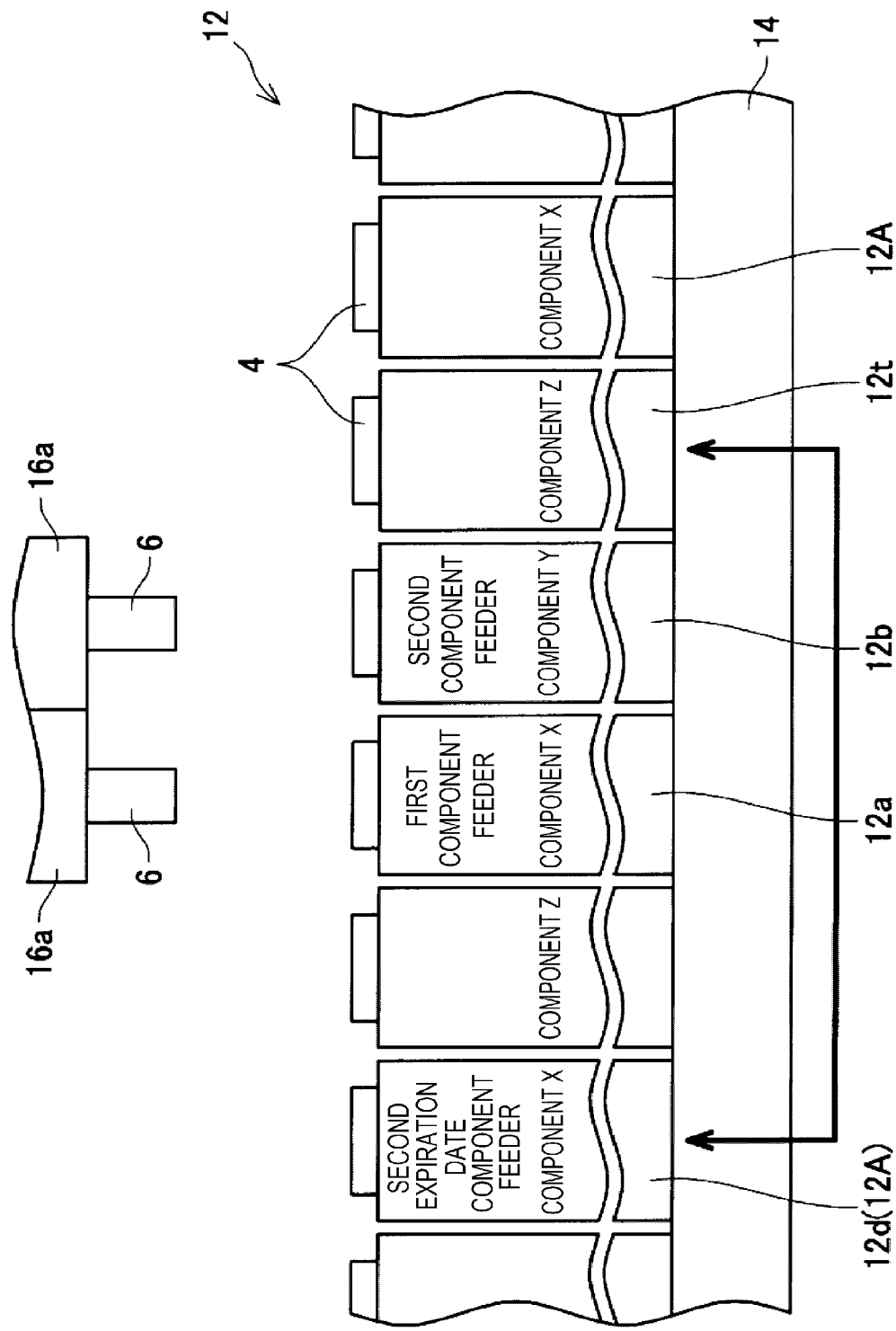
FIG. 9 is a view illustrating a state of changing an attachment position of a second expiration date component feeder.

In S54, as illustrated in FIG. 9, control device 32 outputs an instruction to loader 24 to change the attachment position of second expiration date component feeder 12b to the position (attachment position of component feeder 12t) at which the simultaneous pickup by mounting head 16 is possible, with respect to the attachment position at which second component feeder 12d is attached. S56 to S58 are the same as S26 and S28 in FIG. 3.

Meanwhile, in a case where it is determined that first expiration date component feeder 12c is present (YES in S50), in S60, control device 32 outputs an instruction to each section to stop the simultaneous pickup of components X and Y from first component feeder 12a and second component feeder 12b, and execute the production operation using first expiration date component feeder 12c. More specifically, control device 32 outputs an instruction to subsequently pick up components X supplied from first expiration date component feeder 12c and components Y supplied from second component feeder 12b, and mount the picked-up components on circuit board 2.

In S62, control device 32 determines the next feeder. Specifically, in a case of NO in S52, based on the attachment position at which each first same type component feeder 12A is attached and the attachment position at which second component feeder 12b is attached, control device 32 determines first same type component feeder 12A attached to the position at which the simultaneous pickup with components Y supplied from second component feeder 12b is possible, as next feeder 12e (refer to FIG. 7). In a case of YES in S52, control device 32 determines second expiration date component feeder 12d of which the attachment position has been changed as the next feeder. In a case of YES in S50, control device 32 determines first component feeder 12a of which the simultaneous pickup is stopped, as the next feeder. When executing S62, control device 32 ends the series of processes.

In a case where first expiration date component feeder 12c is present (YES in S50), control device 32 of the present embodiment uses components X of first expiration date component feeder 12c of which the use expiration date is approaching, prior to the simultaneous pickup of components X and Y from first component feeder 12a and second component feeder 12b, and thus it is possible to suppress the use expiration of the components.

In a case where second expiration date component feeder 12d (that is, the component feeder for accommodating the components of which the use expiration date is approaching) is present (YES in S52), information is output to loader 24 for prompting to change the attachment position of second expiration date component feeder 12d to a position which enables the simultaneous pickup with components Y supplied from second component feeder 12b (S54). Then, second expiration date component feeder 12d is determined as the next feeder. In this manner, by changing the attachment position of second expiration date component feeder 12d in advance before the use expiration date of the components approaches, when component shortage occurs in first component feeder 12a, it is possible to use second expiration date component feeder 12d and continue the simultaneous pickup of components to be used. Therefore, it is possible to mount the components efficiently.

THIRD EMBODIMENT

Next, a mounting apparatus according to a third embodiment will be described.

In the present embodiment, the next feeder is determined when the component shortage occurs in the original feeder. Hereinafter, with reference to FIG. 10, the process in which control device 32 of a third embodiment determines component feeder 12 to be used by the mounting apparatus will be described.

S70 to S76 are the same as S10 to S16 in FIG. 3. In S78, control device 32 determines whether the component shortage occurs in the original feeder (that is, first component feeder 12a). In a case where it is determined that component shortage occurs in first component feeder 12a (YES in S78), the process proceeds to S80, and in a case where it is determined that component shortage occurs in first component feeder 12a (NO in S78), S78 is repeated.

In S80, based on the component feeder information, control device 32 determines whether first same type component feeder 12A attached to a position at which the simultaneous pickup with components Y supplied from second component feeder 12b is possible is present. In a case where it is determined that first same type component feeder 12A attached to a position at which the simultaneous pickup with components Y of second component feeder 12b is possible is present (YES in S80) the process proceeds to S92, and in a case where it is determined that first same type component feeder 12A attached to a position at which the simultaneous pickup with components Y of second component feeder 12b is possible is not present (NO in S80), the process proceeds to S82.

Figure 11:
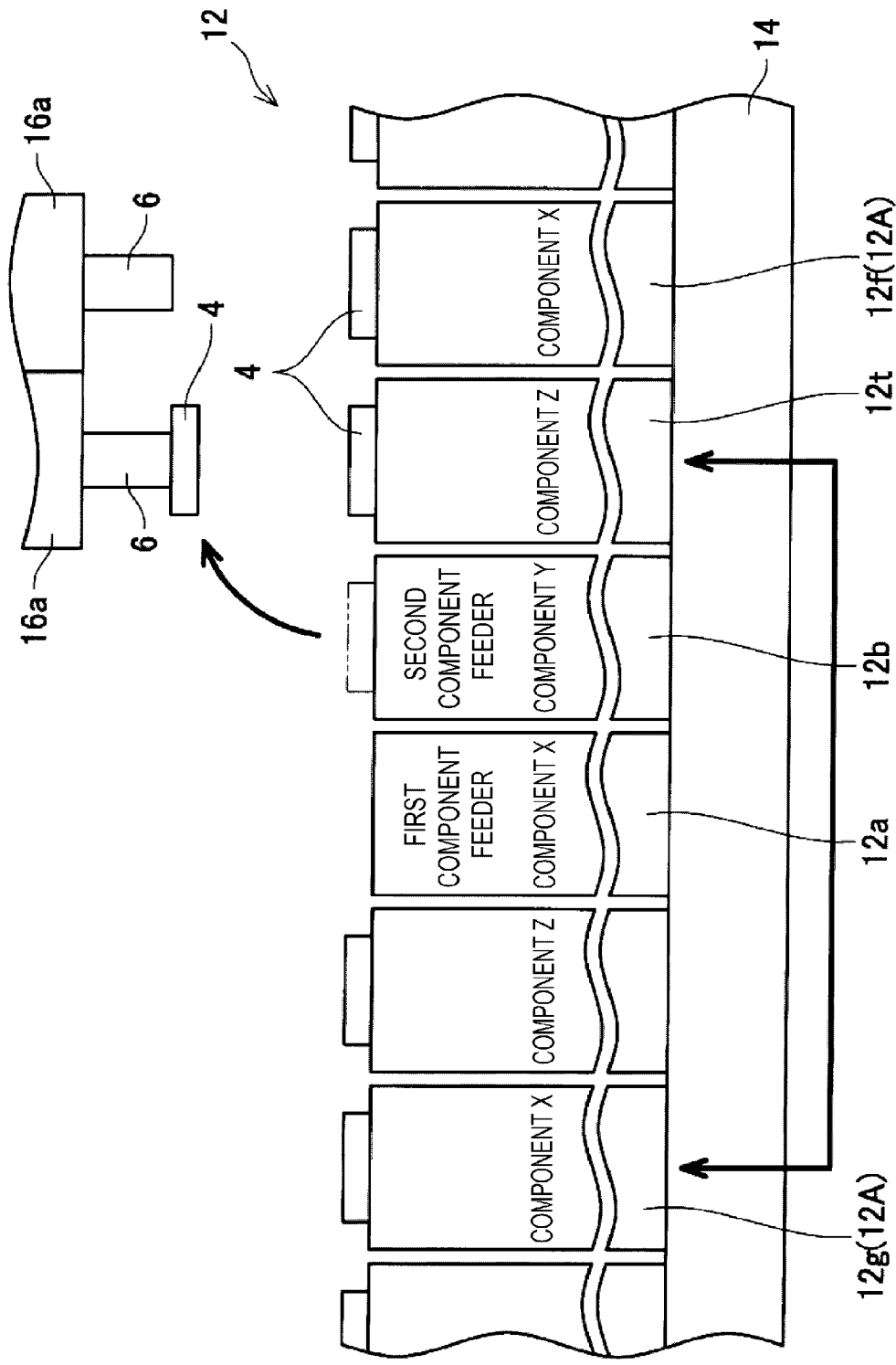
FIG. 11 is a view illustrating a state of changing an attachment position of the other one first same type component feeder and a state of executing subsequent pickup.

In S82, as illustrated in FIG. 11, control device 32 determines one of first same type component feeders 12A as component feeder 12f for supplying components X to mounting head 16. In a case where multiple first same type component feeders 12A are present, any one of first same type component feeders 12A may be determined.

In S84, control device 32 outputs an instruction to each section to subsequently pick up components Y supplied from second component feeder 12b, and components X supplied from the one component feeder 12f determined in S82, by mounting head 16. Here, as illustrated in FIG. 11, a case of subsequently picking up components X and Y means, for example, a case of picking up component X of component feeder 12f by another nozzle 6 in a state where component Y is picked up by one nozzle 6 after component Y of second component feeder 12b is picked up.

In S86, from among first same type component feeders 12A, control device 32 selects one component feeder 12g different from first same type component feeder 12A (component feeder 12f) determined in S82. In a case where multiple first same type component feeders 12A to be selected are present, any one of first same type component feeders 12A to be selected may be determined.

In S88, as illustrated in FIG. 11, control device 32 outputs an instruction to loader 24 to change the attachment position of component feeder 12g selected in S86 to a position which enables the simultaneous pickup by mounting head 16, with respect to the attachment position which second component feeder 12b is attached. S90 to S92 are the same as S26 and S28 in FIG. 3. During the process of S88 to S92, mounting head 16 executes the subsequent pickup of components X and Y from second component feeder 12b and one component feeder 12f determined in S82.

Figure 12:
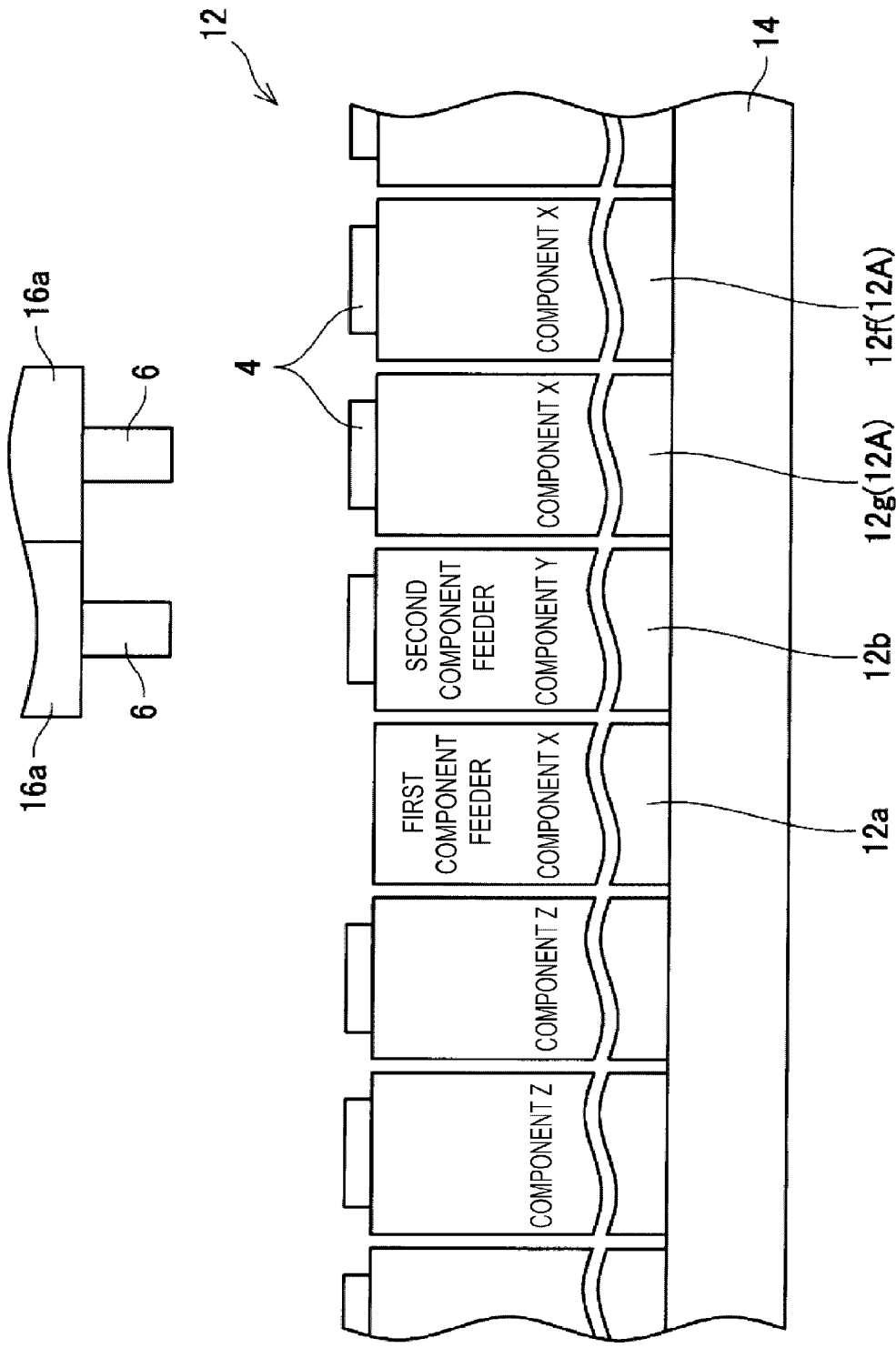
FIG. 12 is a view illustrating an example of a next feeder determined by the process of FIG. 10.

In S94, as illustrated in FIG. 12, control device 32 determines first same type component feeder 12A (that is, component feeder 12g selected in S88) of which the attachment position is changed in S90, as next feeder 12e. Then, in S96, control device 32 outputs an instruction to each section to simultaneously pick up components X supplied from determined next feeder 12e and components Y supplied from second component feeder 12b, by mounting head 16. When executing S96, control device 32 ends the series of processes.

When component shortage occurs in first component feeder 12a, in a case where first same type component feeder 12A of which the simultaneous pickup is possible is not present (NO in S80), control device 32 of the present embodiment outputs an instruction to each section to use one first same type component feeder 12A and second component feeder 12b, and subsequently pick up components X and Y (S84). Then, while picking up components X and Y in order, information is output to loader 24 for prompting to change the attachment position of another one first same type component feeder 12A to a position at which the simultaneous pickup with components Y supplied from second component feeder 12b is possible (S86). Then, another one first same type component feeder 12A is determined as the next feeder (S94). In this manner, in the present embodiment, until the preparation of component feeder 12 in which the simultaneous pickup of components X and Y is possible is finished (until the attachment position is changed, by using a separate component feeder tentatively, it is possible to suppress deterioration of production efficiency.

FOURTH EMBODIMENT

Figure 13:
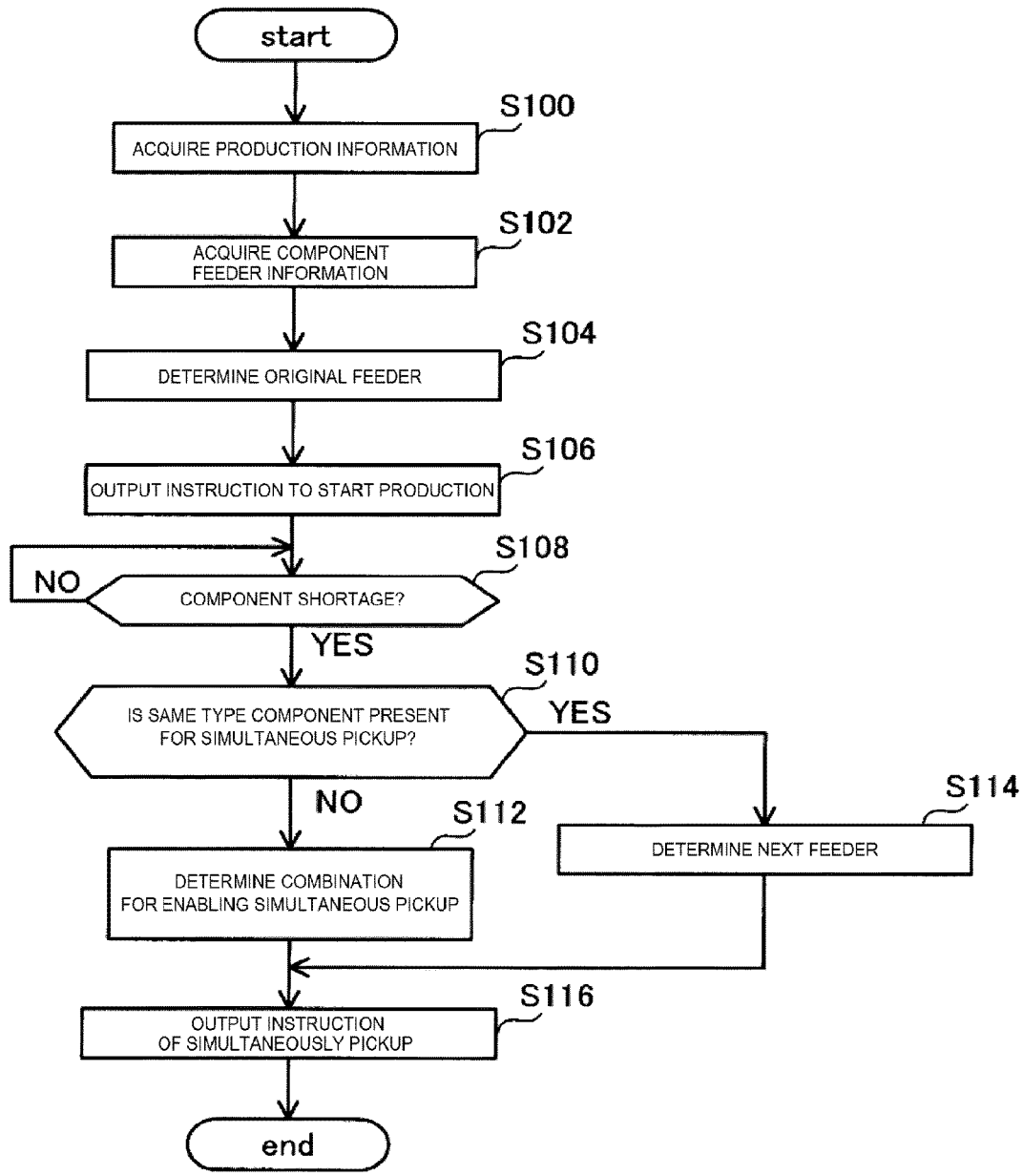
FIG. 13 is a flowchart illustrating a process executed by a control device (determination device) of a fourth embodiment.

Next, a mounting apparatus according to a fourth embodiment will be described. In the present embodiment, in a case where first same type component feeder 12A in which the simultaneous pickup is possible is not present when component shortage occurs in one original feeder, another original feeder (in which components are remaining) is also changed together. Hereinafter, with reference to FIG. 13, control device 32 of the fourth embodiment, the process of determining component feeder 12 to be used by the mounting apparatus will be described.

Figure 10:
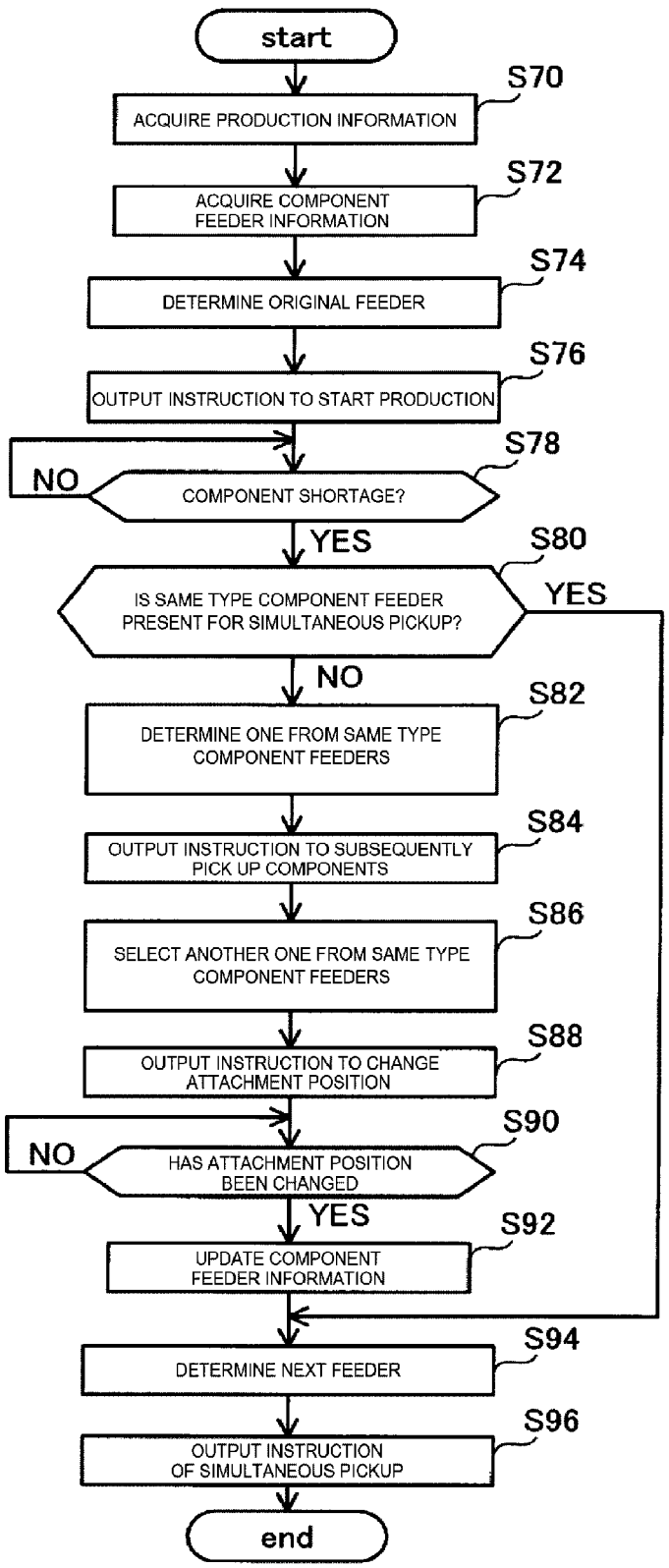
FIG. 10 is a flowchart illustrating a process executed by a control device (determination device) of a third embodiment.

S100 to S110 are the same as S70 to S80 in FIG. 10. In a case where NO is determined in S110, in S112, control device 32 determines the combination in which the simultaneous pickup of components X and Y is possible, from multiple component feeders 12 attached to feeder holding section 14. Specifically, first, control device 32 extracts first same type component feeder 12A and second same type component feeder 12B from among multiple component feeders 12 attached to feeder holding section 14. Second same type component feeder 12B is component feeder 12 for accommodating the same type of component (that is, component Y) as the component accommodated in second component feeder 12b. Then, as illustrated in FIG. 14, from among first same type component feeders 12A and second same type component feeders 12B which are extracted, control device 32 determines combination 12C of first same type component feeder 12A and second same type component feeder 12B which are attached in a positional relationship in which the simultaneous pickup of components X and components Y is possible.

Meanwhile, in a case where YES is determined in S110, control device 32 determines the next feeder in S114. S114 is the same as S94 in FIG. 10.

In S116, control device 32 outputs an instruction to each section to simultaneously pick up component X and component Y by mounting head 16. Specifically, in a case of NO in S110, control device 32 instructs the simultaneous pickup of components X and components Y supplied from combination 12C determined in S112. In a case of YES in S110, it is instructed to simultaneously pick up components X and components Y supplied from next feeder 12e and second component feeder 12b determined in S114. When executing S116, control device 32 ends the series of processes.

When component shortage occurs in first component feeder 12a, in a case where first same type component feeder 12A in which the simultaneous pickup with components Y of second component feeder 12b is possible is not present (NO in S110), control device 32 of the present embodiment outputs information for prompting to determine the combination of first same type component feeder 12A and second same type component feeder 12B in a positional relationship in which the simultaneous pickup of components X and components Y is possible (S112), and perform the simultaneous pickup of components X and components Y supplied from the combination (S116). Therefore, even in a case where first same type component feeder 12A in which the simultaneous pickup with component Y supplied from second component feeder 12b is not present, it is possible to continue the simultaneous pickup of components X and Y, and it is possible to maintain the mounting efficiency of components.

(Correspondence Relationship)

First component feeder 12a and second component feeder 12b are examples of the "first specific component feeder" and the "second specific component feeder", respectively. Component X and component Y are examples of the "first specific type of component" and the "second specific type of component", respectively. Loader 24 is an example of the "changing device". S12, S42, S72, and S102 are examples of the process executed by the "component feeder information acquisition section". S32, S62, S94, S112, and S114 are examples of the process executed by the "component feeder determination section". S22 is an example of the process executed by the "first output section". S20 and S50 are examples of the process executed by the "first detecting section". S60 is an example of the process executed by the "third output section". S52 is an example of the process executed by the "second detecting section". S54 is an example of the process executed by the "fourth output section". S84 is an example of the process executed by the "sixth output section". S88 is an example of the process executed by the "seventh output section". S116 is an example of the process executed by the "ninth output section".

In each of the above-described embodiments, in order to make it easy to understand, two adjacent component feeders 12 are described as a positional relationship in which the simultaneous pickup is possible, but the positional relationship in which the simultaneous pickup is possible may be appropriately changed by the arrangement of holding sections 16a of mounting head 16, the type of nozzle 6, and the like.

In each of the above-described embodiments, a case where two electronic components 4 (components X and Y) are simultaneously picked up has been described, but the technique disclosed in the present description can also be effectively applied to a case where three or more electronic components 4 are simultaneously picked up.

In the first embodiment, control device 32 need not acquire the production information, need not determine whether first expiration date component feeder 12c is present, or need not output an instruction to change the attachment position of first expiration date component feeder 12c. In other words, S10, S20, and S22 in FIG. 3 may be omitted. In other words, the "production information acquisition section", "first detecting section", and "first output section" can be omitted. In addition, S14, S16, and S24 to S30 need not be executed. Generally speaking, control device 32 may execute at least the processes of S12, S18, and S32. In S12, the use expiration date of electronic component 4 accommodated in each component feeder 12 need not be acquired.

Further, in each of the above-described embodiments, control device 32 outputs an instruction to loader 24 to change the attachment position of first expiration date component feeder 12c or the like (S22, S52, and S88), but instead of this, information for prompting to change the attachment position of first expiration date component feeder 12c or the like may be displayed on touch panel 30. In the present modification example, the processes of S22, S52, and S88 are examples of the process executed by the "second output section", the "fifth output section", and the "eighth output section", respectively.

While specific examples of the technology disclosed in the present description have been described in detail above, this is merely illustrative and does not limit the scope of the claims. An apparatus or method described in the claims includes modifications or alterations resulting when the specific example is modified or altered variously. In addition, the technical elements described in the present description and the drawings exhibit technical usefulness alone or in various combinations and are not limited to the combinations described herein.

REFERENCE SIGNS LIST

2: circuit board, 4: electronic component, 6: nozzle, 10: component mounting apparatus, 12: component feeder, 12A: first same type component feeder, 12B: second same type component feeder, 12a: first component feeder, 12b: second component feeder, 12c: first expiration date component feeder, 12d: second expiration date component feeder, 12e: next feeder, 14: feeder holding section, 16: mounting head, 16a: holding section, 18: head moving mechanism, 22: board chute, 24: loader, 26: feeder accommodation section, 30: touch panel, 32: control device

The invention claimed is:

1. A determination device that determines a component feeder to be used from among multiple component feeders attached to a feeder holding section, in a component mounting machine which includes the feeder holding section to which the multiple component feeders are attached and a mounting head capable of simultaneously picking up components from the multiple component feeders attached to the feeder holding section, the component mounting machine mounting the components picked up by the mounting head onto a board, the determination device comprising:
a component feeder information acquisition section configured to acquire an attachment position at which the component feeder is attached and a type of component accommodated in the component feeder, for each component feeder attached to the feeder holding section; and
a component feeder determination section configured to determine the component feeder for supplying a first specific type of component to the mounting head when component shortage occurs in a first specific component feeder, in a case where the first specific type of component supplied from the first specific component feeder and a second specific type of component supplied from a second specific component feeder are simultaneously picked up by the mounting head,
wherein the component feeder determination section determines one first same type component feeder as the component feeder for supplying the first specific type of component to the mounting head, the one first same type component feeder being attached to a position which enables simultaneous pickup with the second specific type of component supplied from the second specific component feeder, the determination being made based on an attachment position at which the first same type component feeder is attached and an attachment position at which the second specific component feeder is attached, in a case where multiple first same type component feeders, each accommodating the first specific type of component, are attached to the feeder holding section.

2. The determination device according to claim 1, wherein the component mounting machine further includes a changing device for changing an attachment position of the component feeder attached to the feeder holding section,
the component feeder information acquisition section further acquires a use expiration date of the component accommodated in the component feeder for each component feeder attached to the feeder holding section, and
the determination device further comprises:
a first detecting section configured to detect a first expiration date component feeder of which a time point is reached a first predetermined period before the use expiration date, among the first same type component feeders for accommodating the first specific type of component; and
a first output section configured to output information to the changing device for prompting to change an attachment position of the first expiration date component feeder to a position which enables simultaneous pickup by the mounting head, with respect to the attachment position at which the second specific component feeder is attached.

3. The determination device according to claim 2, further comprising:
a production information acquisition section configured to acquire a production plan and a production speed of the component mounting machine, wherein
the component feeder determination section determines to continue using the first specific component feeder even when a time point is reached a first predetermined period before the use expiration date, in a case where it is determined that it is possible to use all of the components accommodated in the first expiration date component feeder until the use expiration date of the first expiration date component feeder is reached, in a case of using the first expiration date component feeder after component shortage occurs in the first specific component feeder, based on the production plan and the production speed.

4. The determination device according to claim 1, wherein the component feeder information acquisition section further acquires a use expiration date of the component accommodated in the component feeder, for each component feeder attached to the feeder holding section, and
the determination device further comprises:
a first detecting section configured to detect a first expiration date component feeder of which a time point is reached a first predetermined period before the use expiration date, among the first same type component feeders for accommodating the first specific type of component; and
a second output section configured to output information for prompting to change an attachment position of the first expiration date component feeder to a position which enables simultaneous pickup by the mounting head, with respect to the attachment position at which the second specific component feeder is attached.

5. The determination device according to claim 1, wherein the component feeder information acquisition section further acquires a use expiration date of the component accommodated in the component feeder, for each component feeder attached to the feeder holding section, and the determination device further comprises:

a first detecting section configured to detect a first expiration date component feeder of which a time point is reached a first predetermined period before the use expiration date, among the first same type component feeders for accommodating the first specific type of component; and a third output section configured to output information to the component mounting machine for prompting to stop simultaneous pickup of the components from the first specific component feeder and the second specific component feeder, and use the component accommodated in the first expiration date component feeder.

6. The determination device according to claim 5, wherein the component mounting machine further includes a changing device for changing an attachment position of a component feeder attached to the feeder holding section, and the determination device further comprises:

a second detecting section configured to detect a second expiration date component feeder of which a time point is reached a second predetermined period of which a period from the use expiration date is longer than that of the first predetermined period before the use expiration date among the first same type component feeders for accommodating the first specific type of component; and a fourth output section configured to output information to the changing device for prompting to change an attachment position of the second expiration date component feeder to a position which enables the simultaneous pickup by the mounting head, with respect to the attachment position at which the second specific component feeder is attached.

7. The determination device according to claim 5, further comprising:

a second detecting section configured to detect a second expiration date component feeder of which a time point is reached a second predetermined period of which a period from the use expiration date is longer than that of the first predetermined period before the use expiration date, among the first same type component feeders for accommodating the first specific type of component; and a fifth output section configured to output information for prompting to change an attachment position of the second expiration date component feeder to a position which enables the simultaneous pickup by the mounting head, with respect to the attachment position at which the second specific component feeder is attached.

8. The determination device according to claim 1, wherein the component mounting machine further includes a changing device for changing an attachment position of the component feeder attached to the feeder holding section, the component feeder determination section determines one first same type component feeder, being attached to the feeder holding section, as the component feeder for supplying the first specific type of component to the mounting head, when component shortage occurs in the first specific component feeder, when the first same type component feeder attached to a position at which simultaneous pickup with the second specific type of component supplied from the second specific component feeder is possible is not present, and the determination device further comprises:

a sixth output section configured to output information to the component mounting machine for prompting to subsequently pick up the second specific type of component supplied from the second specific component feeder and the first specific type of component supplied from the determined first same type component feeder; and a seventh output section configured to output information to the changing device for prompting to change an attachment position of the other one first same type component feeder for accommodating the first specific type of component to a position which enables the simultaneous pickup by the mounting head, with respect to the attachment position at which the second specific component feeder is attached.

9. The determination device according to claim 1, wherein the component feeder determination section determines one first same type component feeder, being attached to the feeder holding section, as the component feeder for supplying the first specific type of component to the mounting head, when component shortage occurs in the first specific component feeder, when the first same type component feeder attached to a position at which simultaneous pickup with the second specific type of component supplied from the second specific component feeder is possible is not present, and the determination device further comprises:

a sixth output section configured to output information to the component mounting machine for prompting to subsequently pick up the second specific type of component supplied from the second specific component feeder and the first specific type of component supplied from the determined first same type component feeder; and an eighth output section configured to output information for prompting to change an attachment position of the other one first same type component feeder for accommodating the first specific type of component to a position which enables the simultaneous pickup by the mounting head, with respect to the attachment position at which the second specific component feeder is attached.

10. The determination device according to claim 1, wherein the component feeder determination section determines a combination of the first same type component feeder and a second same type component feeder which are attached in a positional relationship in which simultaneous pickup of the first specific type of component and the second specific type of component is possible, from among the first same type component feeders and the second same type component feeders, when component shortage occurs in the first specific component feeder, in a case where multiple second same type component feeders for accommodating the second specific type of component are attached to the feeder holding section, when the first same type component feeder attached to a position at which simultaneous pickup with the second specific type of component supplied from the second specific component feeder is possible is not present, and the determination device further comprises:

a ninth output section configured to output information to the component mounting machine for prompting to simultaneously pick up the first specific type of component and the second specific type of component which are supplied from the combination of the first same type component feeder and the second same type component feeder.

11. A component mounting apparatus that mounts components onto a board, comprising:
- a feeder holding section to which multiple component feeders are attached;
- a mounting head capable of simultaneously picking up components from the multiple component feeders attached to the feeder holding section; and
- the determination device according to claim 1.

* * * * *